US007166366B2

(12) United States Patent
Moser

(10) Patent No.: US 7,166,366 B2
(45) Date of Patent: Jan. 23, 2007

(54) PROTECTIVE AND/OR DIFFUSION BARRIER LAYER

(75) Inventor: Eva Maria Moser, Löhningen (CH)

(73) Assignee: Incoat GmbH, Lohningen (CH)

( * ) Notice: Subject to any disclaimer, the term of this patent is extended or adjusted under 35 U.S.C. 154(b) by 0 days.

(21) Appl. No.: 10/182,276

(22) PCT Filed: Jan. 26, 2001

(86) PCT No.: PCT/CH01/00059

§ 371 (c)(1),
(2), (4) Date: Nov. 26, 2002

(87) PCT Pub. No.: WO01/55489

PCT Pub. Date: Aug. 2, 2001

(65) Prior Publication Data

US 2003/0148139 A1    Aug. 7, 2003

(30) Foreign Application Priority Data

Jan. 27, 2000    (CH) ........................... 158/00

(51) Int. Cl.
  B32B 5/14    (2006.01)
  B32B 5/16    (2006.01)
  B32B 5/30    (2006.01)
  B32B 15/08   (2006.01)
  B32B 19/02   (2006.01)
(52) U.S. Cl. .................. 428/610; 428/626; 428/323; 428/328; 428/212; 428/220; 428/330; 428/332; 428/334; 428/339; 428/457

(58) Field of Classification Search ............... 428/626, 428/624, 686, 323, 328, 212, 220, 332, 334, 428/339, 457, 697, 936, 938, 330, 610
See application file for complete search history.

(56) References Cited

U.S. PATENT DOCUMENTS 4,373,004 A * 2/1983 Asano et al. .......... 430/270.11

(Continued)

FOREIGN PATENT DOCUMENTS

WO    WO 99/63129    12/1999

(Continued)

OTHER PUBLICATIONS

Electrochemical Series, P. Vanysek, Section 8: Analytical Chemistry, CRC Press, 2000 (no month), www.knovel.com/knovel2.*

(Continued)

Primary Examiner—Michael E. Lavilla
(74) Attorney, Agent, or Firm—Notaro & Michalos PC

(57) ABSTRACT

A composite comprises a chemical, mechanical and/or optical protective and/or diffusion barrier layer disposed on a metal or plastic substrate. The layer consists of an organic layer matrix with metal-containing particles dispersed therein, the metal-containing organic layer being plasma-polymerized starting from at least one hydrocarbon which can be substituted and one metal-containing component. The protective and/or diffusion barrier layer is used in a thickness (d) in the submicron range and contains metal particles finely dispersed therein, that have a grain size that lies below 50% of the layer thickness (d). The organic layer matrix is deposited by plasma polymerization from a process gas that comprises at least one hydrocarbon that can also be substituted and one metal-containing component and/or an inorganic gas in a reactor that can be evacuated.

21 Claims, 4 Drawing Sheets

U.S. PATENT DOCUMENTS

Figure 1:
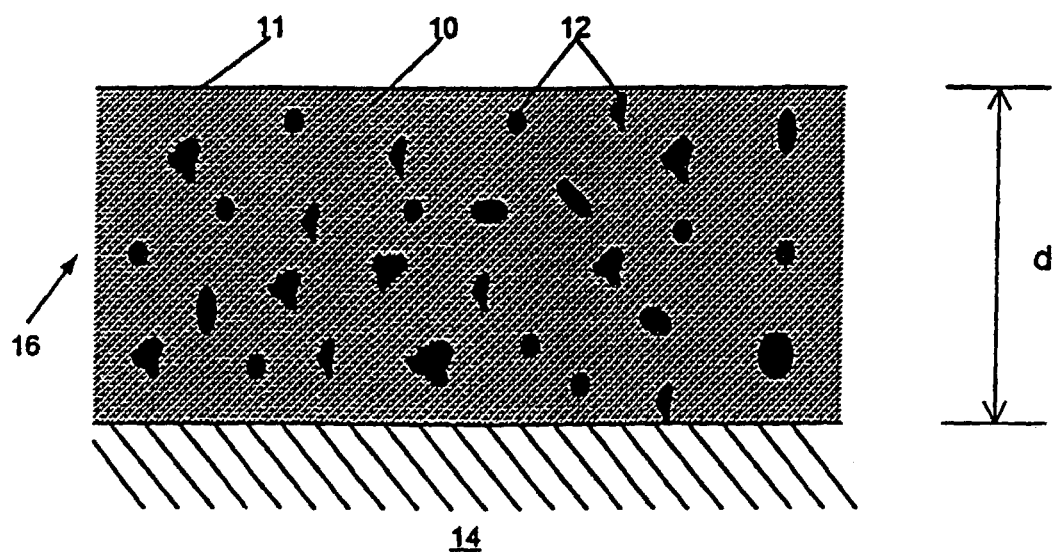

| | | | | |
|---|---|---|---|---|
| 5,358,669 | A | * | 10/1994 | Demiryont et al. ......... 252/587 |
| 5,418,056 | A | * | 5/1995 | Noguchi et al. ............ 428/323 |
| 5,534,582 | A | * | 7/1996 | Krause et al. .............. 524/441 |
| 5,906,882 | A | * | 5/1999 | Valente et al. .............. 428/148 |
| 6,416,855 | B1 | * | 7/2002 | Rossignol et al. .......... 428/323 |
| 2002/0012789 | A1 | * | 1/2002 | Iijima ......................... 428/328 |
| 2002/0039667 | A1 | * | 4/2002 | Takaya et al. .............. 428/692 |

FOREIGN PATENT DOCUMENTS

| | | |
|---|---|---|
| WO | WO 01/55489 | 8/2001 |

OTHER PUBLICATIONS

An article entitled "Metal-Containing Plasma-Polymerized Films", By Yoshihiro Asano, published 1983 pp. 319-411, July.

An article entitled "Metal Doped Fluorocarbon polymer Films Prepared By Plasma . . . ", By Biederman et al., published 1983, pp. 497-503, July.

An article entitled "Plasma Chemical Vapour Deposition of Iron-Containing . . . ", By Wrobel et al., published 1992, pp. 42-58, July.

* cited by examiner

PROTECTIVE AND/OR DIFFUSION BARRIER LAYER

The invention relates to a chemical, mechanical and/or optical protection and/or diffusion barrier layer on a metal or plastic substrate, which layer consists of an organic layer matrix with dispersed metal-containing particles, where this layer is plasma-polymerised on the basis of at least one possibly substituted hydrocarbon and a metal-containing component. The invention also relates to a process for application of the protection and/or diffusion barrier layer, where the organic layer matrix is deposited by plasma polymerisation from a process gas with at least one possibly substituted hydrocarbon, a metal-containing component and/or an inorganic gas. Finally, the invention relates to uses of the protection and/or diffusion barrier layer and applications of the process.

Plasma polymerisation layers which are used for the organic layer matrix of the present invention have the advantage that they change their properties due to targeted process treatment and can be adapted for numerous requirements. Plasma polymerisation layers can also have a high degree of reticulation, a high density and adequate hardness. Thanks to the usually amorphous layer structure, they are highly chemically and mechanically resistant, largely micropore free and have a smooth layer surface. Nonetheless, plasma polymerisation layers with corresponding process treatment are characterised by good adhesion strength even on reaction-inert substances.

Targeted process treatment can in essence be achieved by the following process parameters when using low pressure plasmas: discharge method, monomer selection, monomer flow rate, coating duration, excitation power of the plasma, process pressure, substrate distances and applied bias potential.

A plasma, in the present case as stated a low pressure plasma, is generated for example by magnetron sputtering, high frequency or microwave discharge processes. Hydrocarbon monomers, even substituted, enter an evacuable plasma reactor through an inlet nozzle. There, the energy-rich electrons initiate complex reactions which, depending on the process, can lead to homogeneous amorphous or crystalline, elastic or rigid layers.

WO 96/28587 discloses a plasma chamber for polymerisation, WO 99/39842 a process for coating substrates with polar coating by means of plasma polymerisation and WO 99/50472 an organic diffusion barrier layer deposited on a substrate with a non-polar basic structure and high barrier effect to volatile gases, vapours and fluids. Reference is made expressly to these publications for all known details. Depending on the monomers supplied in the process gas, hydrophobic non-polar layers or hydrophilic polar layers can be deposited.

Numerous publications are known which describe protective and/or diffusion barrier layers of an amorphous plastic matrix, usually a hydrocarbon layer, with dispersed metal particles. For example A. M. Wróbel, G. Czeremuszkin, H. Szymanowski, H. Shur, J. E. Klemberg-Sapieha, M. R. Wertheimer in the Journal of Chemical Vapor Deposition, 1, 1992, 42, describe the chemical deposition from the gaseous phase of hydrocarbon layers containing iron particles by means of a plasma. E. Feurer and H. Suhr in Applied Physics A 44, 171–175 (1987) also disclose a corresponding deposition of layers containing gold.

The metal-containing amorphous hydrocarbon layers, which are suitably 1 to 3.5 µm thick, show in comparison to metal-free amorphous hydrocarbon layers a better adhesion, better wear protection, good optical permeability and excellent tribological properties. The incorporation of electroactive centres makes the layers as a whole electrically conductive, where the electrical conductivity correlates with the metal content, the metal particle size and distribution.

The present invention is based on the task of creating a protection and/or diffusion barrier layer and a process of the type described initially which is optimised in relation to barrier effect and elasticity of the protection and/or diffusion barrier layer. Furthermore, the advantages of the protection and/or barrier diffusion layer are utilised in optimal applications.

The foregoing object is attained according to the invention wherein the protection and/or diffusion barrier layer lies in the submicron thickness d with finely dispersed incorporated metal-containing particles of a grain size lying below 50% of the layer thickness d.

Figure 2:
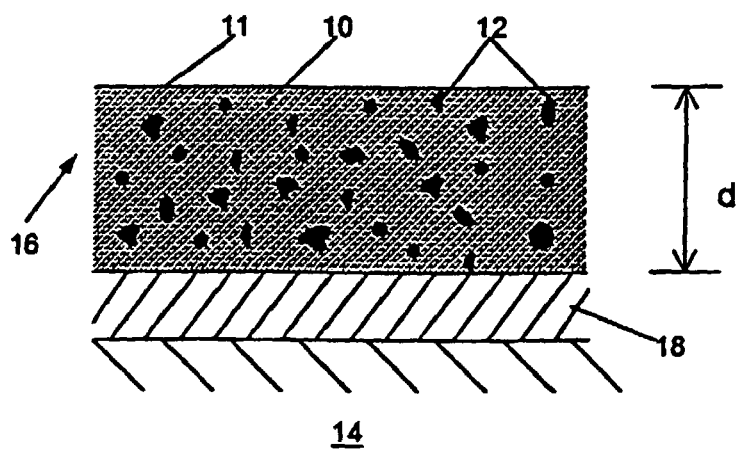
Figure 4:
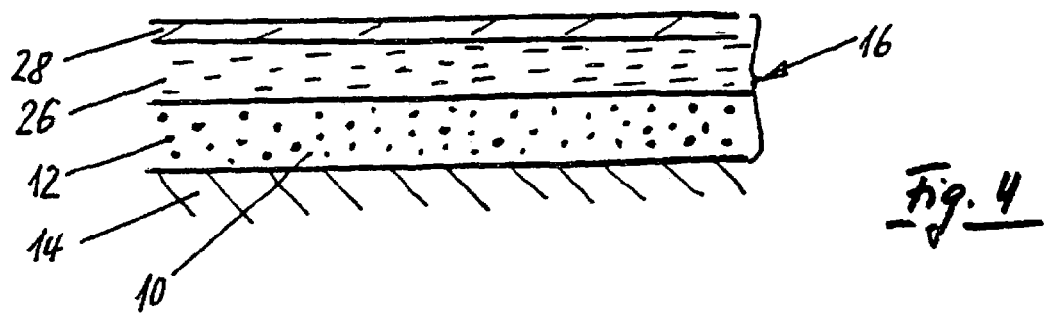
Figure 5:
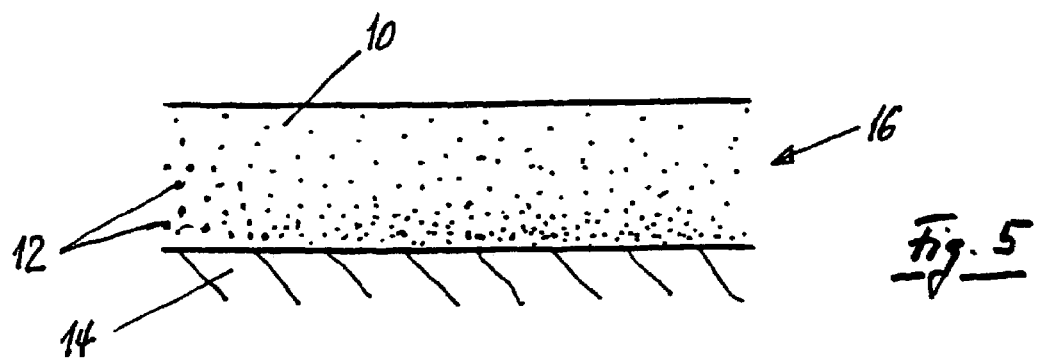
Figure 6:
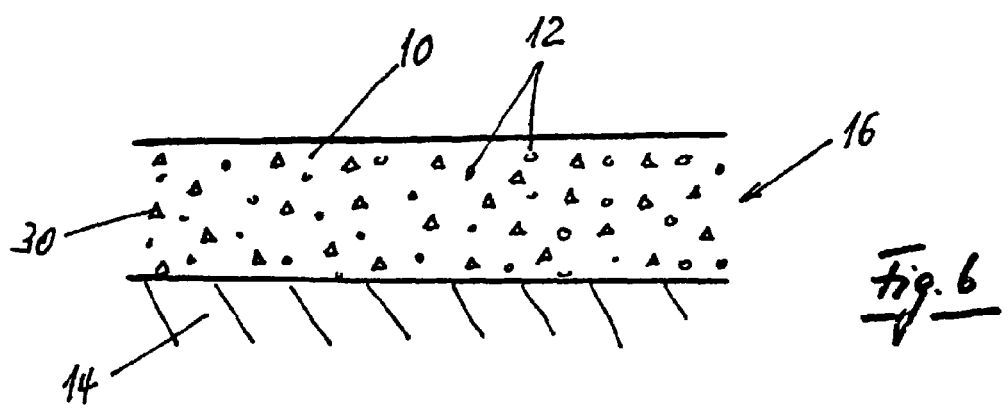
Figure 7:
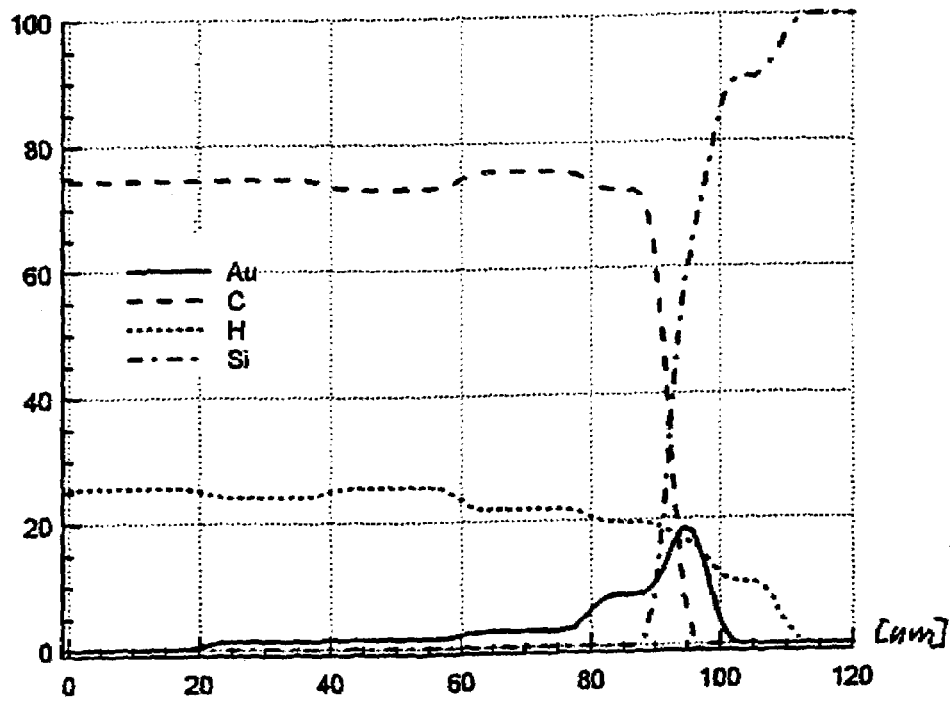
Figure 8:
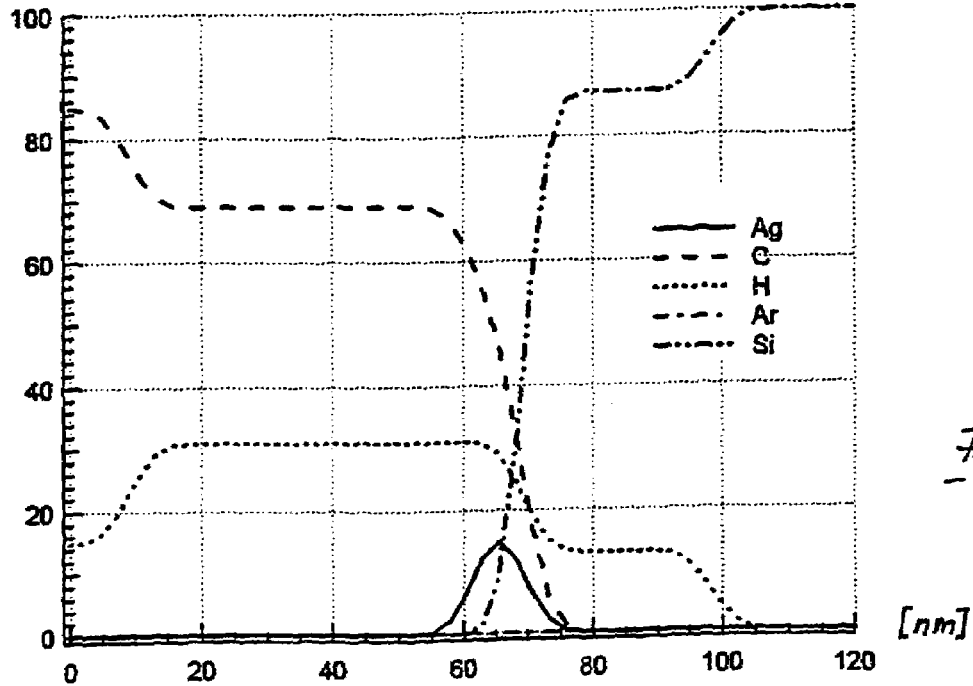

In the Drawings:

FIG. 1 a section through a protection and diffusion barrier layer,

FIG. 2 a variant of FIG. 1,

FIG. 3 a top view onto bright and coated Al films,

FIG. 4 a section through FIG. 1 with two additional surface coatings,

FIG. 5 a variant according to FIG. 1 with a gradient of metal-containing particles, FIG. 6 a variant according to FIG. 1 with an electrically conductive protection and diffusion barrier layer, FIG. 7 a depth profile of a protection and diffusion barrier layer, and FIG. 8 a variant according to FIG. 7.

The layer thickness d of the usually amorphous protection and/or diffusion barrier layer preferably lies in the range from 10 to 500 nm, in particular 20 to 300 nm.

The metal-containing particles preferably have a size of 1 to 250 nm, in particular 10 to 150 nm, the grain size is suitably below 20%, in particular below 10% of the layer thickness d of the protection and/or diffusion barrier layer. The metal-containing particles are formed as individual grains or as a conglomerate of several grains—known as clusters—which however in their overall grain size always remain in the nanometer range i.e. clearly below 1 µm. The metals are for example Ti, Ta, W, Fe, Zn, Sn, Nb, Au, Pd, Ag, Al and/or Cu. The metal-containing particles can be present as pure metals, alloys but also as metal carbides or oxides. Examples of carbide-forming metals are Ta, W, Ti and Nb, oxide-forming metals Fe, Zn and Ag. Only metal particles are used, the carbide and/or oxide particles are formed in situ.

The protection and/or diffusion barrier layer has in total a metal content of preferably 0.1 to 65 at %, in particular 1 to 40 at %, corresponding to the optimum electrical conductivity to be achieved. This is not however the only assessment criterion, for example the best combination of a low friction co-efficient with the optimum mechanical properties must also be taken into account. These can be achieved with an adjustable metal proportion in the protection and/or diffusion barrier layer, where it must be noted that these values are also dependent on the parameters of material, particle size and distribution. Thus for example the incorporation of Ti particles into the plastic matrix achieves a better adhesion on steel than the incorporation of W particles.

For non carbide-forming metals e.g. Au, Ag, Cu, Pd and Pt, pure metal, however with oxide formation, is incorporated in the organic layer matrix, usually a hydrocarbon matrix. In the case of Nb up to a metal content of 50 at % a mixture of carbide- and polymer-like bonded carbon is noted, above 50 at % Nb only carbide-bonded carbon is present.

The sub-micron metal particles or metal, metal carbide or metal oxide clusters distributed finely dispersed in the insulating organic layer matrix, above a particular threshold value form a percolative network which can increase the electrical conductivity sharply. For gold this threshold value is for example above 25.4 at %.

For cathodic corrosion protection, metal particles which are less noble than the metals in the substrate are integrated in the protection and/or diffusion barrier layer. Similarly for an anodic corrosion protection, metal particles nobler than the metal of the substrate are integrated in the protection and/or diffusion barrier layer.

According to a particular embodiment of the invention, the concentration of metal-containing components decreases as the thickness of the protection and/or diffusion barrier layer increases, in particular the metal particles diminish continuously in the direction of the surface. According to a further embodiment the concentration of metal particles can however increase, also with a corresponding concentration gradient.

According to a further embodiment of the invention over the thickness of the protection and diffusion barrier layer is a polarity gradient, preferably continuous.

The protection and/or diffusion barrier layer can contain particles of two or more different metals which are formed as pure metal, alloy, metal carbide or metal oxide particles.

In relation to the process for application of a protection and diffusion barrier layer according to the invention, the task according to the invention is solved in that during the reaction process, organic monomers and different metal-containing components of the same or different concentrations are introduced into the reactor. Special and further embodiments of the process are the subject of the dependent claims.

The reaction gases are suitably introduced with a carrier gas, usually an inert gas, and/or hydrogen, in particular with helium, neon and/or argon as the inert gas.

In the simplest case the metal-containing or metallic particles are dispersed evenly over the entire thickness of the protection and/or diffusion barrier layer according to the invention. This is achieved by steady addition of the metal components during the entire process. According to the process of the invention this addition can take place differently as required, for example continuously increasing or decreasing. On an increasing rise or fall in the addition of metal-containing components in the reaction gas, the metal proportion in the organic layer matrix rises or falls correspondingly. Thus, the properties, in particular the electrical conductivity, can be influenced in a targeted manner. In all cases at the end at least one diffusion barrier layer is applied without metal-containing particles i.e. as double protection. The protective layer containing metal particles according to the invention first becomes active when the outermost layer is damaged e.g. by scratches, pinholes or other defects. The metal-free diffusion barrier layer(s) guarantees/guarantee excellent long-term protective effect in co-operation with the layer below with metal-containing particles.

According to a further process feature according to the invention in the organic layer matrix of the protection and/or diffusion barrier layer is produced a polarity gradient as monomers with different polarity are introduced and plasma-polymerised over time during the procedure. In particular, in the case of a polar substrate, first polar then increasingly and towards the reaction end exclusively non-polar monomers are introduced even without metal components. For a non-polar substrate, however, first non-polar then increasingly and towards the reaction end exclusively polar monomers are introduced, again even without metal components. The outer surface of the protection and/or diffusion barrier layer in the first case is hydrophobic and in the second hydrophilic.

Process parameters not mentioned specially below arise from the state of the art, where particular reference is made to the said WO publications 96/28587, 99/39842 and 99/50472.

The production of metal-containing plastic layers, usually amorphous hydrocarbon layers, for cathodic and anodic protection preferably takes place in one of the following variants:

The metal particles are generated by cathode sputtering of a corresponding target with the ignited plasma and incorporated in the plastic matrix. As already stated this can be achieved by reactive RF or DC sputtering and by reactive magnetron sputtering (RF, DC, low frequency, mid frequency, pulsed DC), where RF means radio frequency and DC direct current.

Furthermore, metal particles can be produced by vaporisation from corresponding metal pieces, in particular by means of arc discharge and resistive or RF (high frequency) heating, torn from the process gas flow and incorporated finely distributed in the plastic matrix.

Finally, a metal organic compound can be decomposed and deposited forming a plastic matrix with the finely dispersed metal particles. This process is known as plasma MOCVD (plasma metal organic chemical vapour deposition). For example iron (III) acetylacetonate is used as the only educt for the metal particle and the amorphous organic layer matrix. A further example of a metal organic compound which can be used is Al $(C_xH_y)_4$, where x, y=1, 2 . . . n. Further examples of suitable metal components of metal organic compounds are Cu, Ti, Ag, Au, W, Pt, Zn and Pd.

A substantial advantage of the invention is that the protection and diffusion barrier layers, optimised with regard to barrier effect and elasticity and as sub-micron thickness d, can also be optimised with regard to electrical conductivity so that a metal substrate is automatically protected from corrosion. The electrochemical potential of the protection and diffusion barrier layer is set so that the corrosion protection is self-healing at defect points. As already briefly indicated, there are two types of corrosion protection.

Cathodic protection. If the electrochemical potential is pushed in the negative direction by corresponding metal particles, the rest potential is lower than the equilibrium potential for the metal dissolution. Corrosion cannot occur because the potential lies in the stability range of the metal. The base metal particles are themselves oxidised, at the interface of the defective protective layer on the cathodically protected substrate a reduction reaction takes place. The metal particles are oxidised to corresponding metal ions, releasing electrons. At the substrate surface two protons combine forming $H_2$ with two electrons. On a damp substrate surface with oxygen supply, hydroxyl ions can also be formed.

The hydrogen formation could be problematical during bubbling as this leads to inherent stresses. However hydrogen is only released if the potential is pushed to very low values. The choice of metal particle is therefore of greatest importance, the necessary potential can be applied to the correct point and the dissolution of the base metal can take place slowly. Thus for example iron no longer corrodes on contact with zinc because the zinc dissolves slowly. Therefore zinc powder pigment is used in a protective lacquer.

Anodic protection. Passivatable metals such as aluminium at high potentials form stable and highly protective oxide films. Contact with a more refined metal, for example platinum, guides the potential to the area of stable passivity. The passive film could not otherwise form spontaneously under these conditions.

The more refined metal particles act as the cathode and the reduction reaction takes place on the surface of the metal particles, where these however do not themselves change.

The process is not restricted to the incorporation of a single specific metal, an alloy, metal carbide or metal oxide in the plastic matrix to form a protective and/or diffusion barrier layer, simultaneously particles from several pure metals and/or other metal-containing components can be incorporated in the protection and/or diffusion barrier layer. This is advantageously achieved by the use of a target with various metal segments, where several cathode sputtering units can also be used. The sputtering process can also be operated by arrangement of a magnetic field in balanced or unbalanced form.

Finally, the substrate can work with a switched bias (DC, 10 kHz to 100 MHz) and be heated or cooled.

According to all variants and further refined embodiments of the process according to the invention, the deposition of metal particles is overlaid with plasma polymerisation of monomers.

Depending on the substrate, the present invention offers at least one of the following advantages:
corrosion protection
mechanical properties: good adhesion, scratch protection
chemical properties: inert, hydrophobic or hydrophilic
optical properties: UV-absorption, colour, refractive index
tribological properties: wear protection, low friction coefficient
electrical properties which can be varied over a wide range: $10^{-4}$ to $10^{16}$ Ohm/cm, antistatic and antismog effect
good heat conductivity.

Because their properties can be modified by targeted process control over a wide range, the protection and diffusion barrier layers have a broad area of application. Applications of substantial significance are corrosion protection for metals such as silver, aluminium, steel, copper etc. by cathodic or anodic protection with an electrochemical potential corresponding to the metal particles. In concrete terms these are for example Ag conductor tracks, Al reflectors, Al or brass strips. A further substantial use is electrically conductive and optically attractive flexible diffusion barriers for plastic substrates, in particular packagings of plastic, where thanks to the adjustable electrical conductivity of the protection and/or diffusion barrier layers an antistatic effect is achieved, i.e. an electrostatic charge of the plastic prevented, and greater protection against UV radiation and attractive colouring can be achieved.

As well as all usual and evident applications of the process according to the invention, fibres, in particular textile, glass, ceramic and metal fibres, whiskers and wires, can be coated electrically conductively.

Table 1 lists the properties of metal-doped, plasma-polymerised protection and diffusion barrier layers on a 12 μm thick transparent PET film as samples 1 to 10. The layers are tested with regard to properties as diffusion barriers in particular in relation to oxygen and water vapour permeability (OXTR or WVTR). All necessary information is given from table 1 below (page 17) itself or its legend.

Exemplary Embodiments

By reactive pulsed DC magnetron sputtering, overlaid with a gas phase-induced plasma polymerisation in a high vacuum chamber, amorphous hydrocarbon layers are deposited with finely dispersed embedded silver particles which form the protection and/or diffusion barrier layer. The following parameters are used:

| | |
|---|---|
| Target: | silver (diameter 200 mm) |
| Target power: | 100 to 600 W |
| Target to substrate distance: | variable, usually 100 mm |
| Reactive gases: | acetylene, methane or mixtures thereof |
| Gas flows: | argon: 20 cm³/min, acetylene ($C_xH_y$): 1 to 50 cm³/min |
| Process pressure: | $10^{-3}$ to $10^{-1}$ mbar |
| Substrate material: | film of Al, Ag, Cu or steel |
| Substrate potential (bias): | 0 to –600 V |
| Substrate temperature: | 20° C. to 300° C. |

With reference to the drawings, a protection and/or diffusion barrier layer 16 produced according to the present exemplary embodiment is shown diagrammatically in FIG. 1. An amorphous three-dimensional reticulated hydrocarbon matrix 10 with surface 11 contains metal-containing particles 12, the matrix is applied to a substrate 14. The hydrocarbon matrix 10 with metal particles 12 forms the protection and/or diffusion barrier layer 16 which adheres firmly to the substrate 14 and protects this chemically, mechanically and/or optically. In the present case the protection and/or diffusion barrier layer has a thickness d of 20 nm and is applied to a substrate film 14 of 12 μm. Depending on the metal, the particles 12 of a few nanometers in size consists of metal bonded polymer- or diamond-like to the hydrocarbon matrix, an interface of metal carbide, metal oxide, or metal carbide, metal oxide crystallites or combinations thereof. The metal-containing particles 12 can also be formed as corresponding clusters.

In FIG. 2 a metal intermediate layer 18 is applied between the protection and/or diffusion barrier layer 12 and the substrate 14.

Figure 3A:
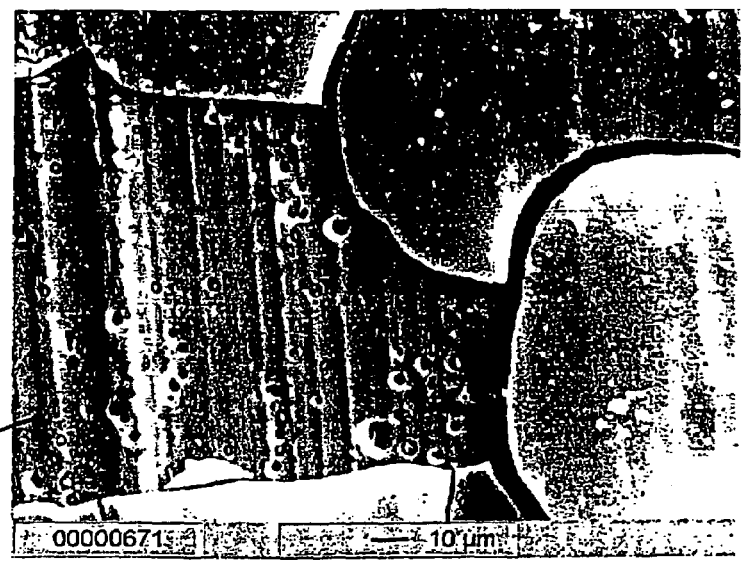

FIG. 3a shows a bright aluminium film 20 sprayed with an NaCl solution during a ten day corrosion test. The $Al_2O_3$ layer is perforated, punctured and partially flaking away.

Figure 3B:

The aluminium film 20 shown in FIG. 3b and protected with a plasma-polymerised, 80 nm thick pure hydrocarbon layer 22, withstands the 10-day saline solution spray test considerably better. At several points however pinholes are evident as defective corrosion points 24.

Figure 3C:
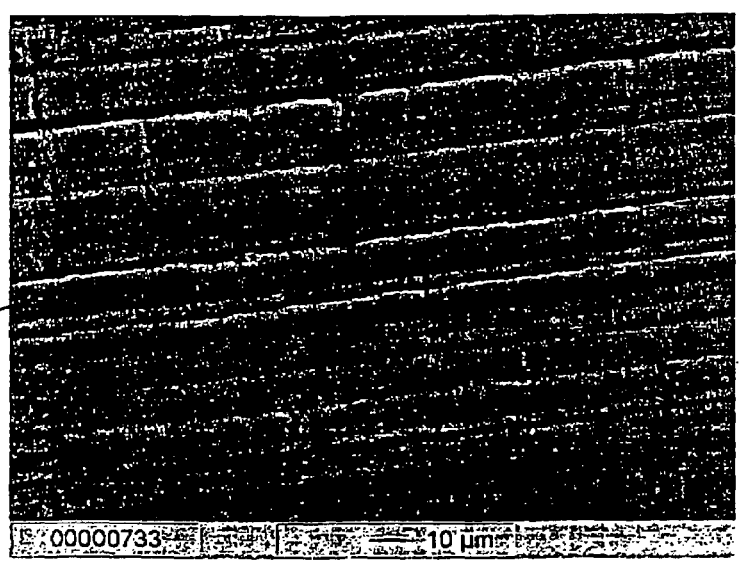

The aluminium film in FIG. 3c with an organic protective matrix 10 according to the invention with invisible metal particles of silver on an aluminium foil survives the 10-day saline solution spray test faultlessly and no corrosion points can be seen.

FIG. 4 substantially corresponds in reduced scale to FIG. 1 and has two layers 26, 28 without metal part applied to the organic layer matrix 10 with regularly incorporated metal-containing particles 12. A first diffusion barrier layer 26 is formed electrically non-conductive and non-polar, a second diffusion barrier layer 28 which forms the surface is polar.

According to further variants not shown:
the first diffusion barrier layer 26 can be formed polar and the second layer 28 non-polar, or
only the first or second layer 26, 28 can be applied.

The diffusion barrier layers 26, 28 individually or together protect the organic layer matrix 10 with metal-containing particles 12 against mechanical and/or chemical effects. If one or both of the layers 26, 28 are damaged, the full effect of the organic layer matrix 10 with metal-containing particles 12 applies.

The protection and/or diffusion barrier layer 16 thus always comprises an organic layer matrix 10 with metal-containing particles 12 and optionally one or two further diffusion barrier layers 26, 28 without metal proportion, which form the surface.

FIG. 5 shows an organic layer matrix 10 deposited on a substrate 14 and in which the metal-containing particles 12 are not homogeneous as in FIG. 4 but particles deposited with a gradient. In the direction of the surface the proportion of metal-containing particles diminishes sharply and can become zero.

Metal-containing particles 12 can be deposited in the organic layer matrix with two different processes at the same time. Homogeneously finely distributed metal particles 12 are produced with plasma MOCVD, the chemical deposition from the gaseous phase using metal organic components for example Ag, Au, Zn, Pt, Al, Pd and/or Fe. The fine-grained particles 12 produced in this way can be identical or different. It is essential that the particle size lies in the nanometer range. Evidently also, according to the embodiment in FIG. 5, further electrically non-conductive layers according to FIG. 3 or 4 can also be applied.

A further variant according to FIG. 6 comprises an organic layer matrix 10 applied to a substrate 14 with regularly distributed metal-containing particles 12. The suitably amorphous hydrocarbon matrix formed here, as in the other exemplary embodiments, consists for example of polypyrol, polyanilin, polythiophene or polyacetylene, each doped with iodine 30, is electrically conductive because organic plasma polymers behave pseudo-metallic as a matrix.

The deposition of metal particles from metal organic compounds by means of a plasma has proved particularly interesting. Particular attention is paid to the non-toxic metals Au, Ag, Pd and W. Pt has a considerable ecotoxic potential in particular in view of aluminium oxide catalysts.

For the deposition of metals from metal organic compounds by means of a plasma there are several further processes which here are listed merely in brief:

thermal evaporation
ion coating
ARE, activated reacted evaporation
cathodic vacuum arc
laser CVD
laser photolysis.

FIG. 7 shows the depth profile for sample 6 in table 1 where the abscissa shows the layer depth in nanometers and the ordinate the chemical composition in atomic percent. The barrier and/or diffusion barrier layer 16 which is 94 nm thick according to Table I contains a total of 4.4 at % gold in the hydrocarbon matrix 10. The depth profile shows that the layer deposited on an Si wafer contains less gold at the surface than at the interface to the substrate 14. At approximately 60 nm layer depth the concentration gradient of gold rises towards the interface continuously and clearly visibly. At the same time the hydrogen content falls and at around 90 nm layer depth also the carbon content. The concentration rise of silicon correlates with the reduction in carbon and in contrast to gold is not smeared. The hydrogen has migrated a few nanometers into the silicon, which is also clearly evident.

The depth profile of sample 6 shows that the layer metal can be distributed over the entire layer and rise clearly with concentration gradients to the boundary phase. Deposition took place by DC sputtering with the substrate to earth.

FIG. 8 shows an equivalent depth profile for sample 8 according to table 1. In this sample in the 51 nm thick layer a silver concentration of total 0.02 at % is shown. In the top 10 nm, the ratio of carbon to hydrogen changes, indicating a subsequent surface reaction.

In contrast to sample 6, in sample 8 at the interface the concentration of silver rises sharply, in total 2.1 at % Ag, and falls equally steeply again as the concentration of silicon increases. The majority of silver is found in the 10 nm at the boundary phase. Hydrogen has again migrated into the top nanometers of the silicon wafer.

Sample 8 shows that the layer metal can also be present only markedly at the interface. Deposition took place by DC sputtering with the substrate to bias.

In order for the metal-containing layer to be at all electrochemically active, the metal-containing particles must at least locally be in contact with the substrate, here silicon. This is shown in both depth profiles.

TABLE 1

Properties of Metal-Doped Plasma Polymerised Protected Layers

| Sample | Type | Power [Watt] | OXTR[a] 0% | OXTR[b] 85% | WVTR[c] 90% | Thickness [nm] | Crack propagation[d] [%] | Electrical resistance [µOhm/cm] | Colour[e] visual | Density[f] [g/cm$^3$] | Chemical composition C | H | Au |
|---|---|---|---|---|---|---|---|---|---|---|---|---|---|
| 1 | Ti-DC | 200 | 4.1 | 3.0 | 1.2 | 139 | 3.1 | — | Yellow brown+ | 1.60 | 75.0 | 25.0 | <0.1 |
| 2 | Au-DC | 100 | 0.9 | 0.8 | 0.4 | 54.0 | 3.1 | $1.310^{11}$ | Grey + | 1.75 | 75.1 | 24.9 | <0.1 |
| 3 | Au-DC | 200 | 0.9 | 0.7 | 0.3 | 108.9 | 2.0 | — | Grey yellow+ | 1.51 | 78.4 | 21.6 | <0.1 |
| 4 | Au-DC | 100 | 1.8 | — | — | 46 | 1.8 | — | — | — | 67.6 | 32.4 | <0.1 |
| 5 | Au-DC | 200 | 117 | — | — |  | 4.1 | — | Purple ++ | — | 64.5 | 29.6 | 5.7 |
| 6 | Au-DC | 400 | 44 | — | — | 94 | 4.0 | — | Brown +++ | — | 65.5 | 30.1 | 4.4 |
| 7 | Au-DC | 200 | 123 | — | — | 59 | 3.6 | $>2.7\ 10^8$ | — | — | 65.7 | 34.2 | 0.1 |
| 8 | Ag-DC | 200 | 70 | — | — | 51 | 4.0 | $1.2\ 10^7$ | — | — | 61.9 | 35.9 | 2.1 |

TABLE 1-continued

Properties of Metal-Doped Plasma Polymerised Protected Layers

| Sample | Type | Power [Watt] | OXTR[a] 0% | OXTR[b] 85% | WVTR[c] 90% | Thickness [nm] | Crack propagation[d] [%] | Electrical resistance [μOhm/cm] | Colour[e] visual | Density[f] [g/cm³] | Chemical composition C | H | Au |
|---|---|---|---|---|---|---|---|---|---|---|---|---|---|
| 9 | Ag-RF | 400 | 119 | — | — | 258 | n.m. | 13.2 | Metallic ++ | — | 42.9 | 13.3 | 43.8 |
| 10 | Ag-RF | 400 | 141 | — | — | 331 | n.m. | 28.9 | Metallic +++ | — | 51.0 | 14.8 | 34.2 |

Legend:
[a] Oxygen permeability [ccm/(m².d.bar)]: ASTM D 3985-95 at 0% relative humidity and 23° C. of the coated 12 mm PET film.
[b] Oxygen permeability [ccm/(m².d.bar)]: ASTM D 3985-85 at 85% relative humidity and 23° C. of the coated 12 mm PET film.
[c] Water vapour permeability [g/m².d]: ASTM F 1249-90 standard test method as 90% relative humidity and 23° C. (American society for testing and materials, 1997)
[d] Crack propagation in [%]: microcrack formation on a coated 12 mm PET film
[e] Colour intensity: + = light, ++ = medium, +++ = dark
[f] Density and chemical composition measured with RBS (Rutherford Backscattering) and/or ERDA (Elastic Recoil Detection Analysis)
DC: Direct current RF: High frequency current

The invention claimed is:

1. An article comprising:
a substrate selected from the group consisting of a metal substrate and a plastic substrate; and
a barrier layer on the substrate having a submicron thickness (d) and comprises a plasma polymerized organic layer matrix with a concentration of finely dispersed metal-containing particles, wherein
the concentration of metal-containing particles increases in the direction of the substrate to form a concentration gradient over the thickness (d) of the barrier layer, the barrier layer having a region wherein the concentration of metal-containing particles increases continuously, and
the particles have a particle size of less than 50% of the thickness (d) of the barrier layer.

2. An article according to claim 1, wherein the substrate is a metal substrate, and wherein the metal particles of the barrier layer are metal particles which are less noble than the metal of the substrate so as to provide cathodic corrosion protection.

3. An article according to claim 1, wherein the substrate is a plastic or metal substrate, and wherein the barrier layer comprises particles of two or more different metals which are formed as pure metal, alloy, metal carbide or metal oxide particles.

4. An article according to claim 1, wherein the particle size of the metal-containing particles lies below 20% of the barrier layer thickness (d).

5. An article according to claim 4, wherein the particle size of the metal-containing particles lies below 10% of the barrier layer thickness (d).

6. An article according to claim 1, wherein, for cathodic corrosion protection, the metal-containing particles are less noble than the metal present in the metal substrate.

7. An article according to claim 1, wherein, for anodic corrosion protection, the metal-containing particles are more noble value than the metal present in the metal substrate.

8. An article according to claim 2, wherein the metal containing substrate has a metallic intermediate layer and on the intermediate layer is deposited the barrier layer.

9. An article according to claim 8, wherein at least one further organic diffusion barrier layer without metal particles is deposited on the barrier layer.

10. An article according to claim 1, wherein the concentration gradient increases continuously over the thickness (d) of the barrier layer.

11. An article according to claim 2, wherein the barrier layer comprises finely dispersed metal particles, and the metal of the metal particles comprises a plurality of different metals.

12. An article comprising:
a substrate selected from the group consisting of a metal substrate and a plastic substrate; and
a barrier layer on the substrate having a submicron thickness (d) and comprises a plasma polymerized organic layer matrix with a concentration of finely dispersed metal-containing particles, wherein
the concentration of metal-containing particles decreases in the direction of the substrate to form a concentration gradient over the thickness (d) of the barrier layer, the barrier layer having a region wherein concentration of metal-containing particles decreases continuously and
the particles have a particle size of less than 50% of the thickness (d) of the barrier layer.

13. An article according to claim 12, wherein the substrate is a metal substrate, and wherein the metal particles of the barrier layer are metal particles which are less noble than the metal of the substrate so as to provide cathodic corrosion protection.

14. An article according to claim 12, wherein the substrate is a metal or plastic substrate, and wherein the barrier layer comprises particles of two or more different metals which are formed as pure metal, alloy, metal carbide or metal oxide particles.

15. An article according to claim 12, wherein the particle size of the metal-containing particles lies below 20% of the barrier layer thickness (d).

16. An article according to claim 4, wherein the particle size of the metal-containing particles lies below 10% of the barrier layer thickness (d).

17. An article according to claim 12, wherein, for cathodic corrosion protection, the metal-containing particles are less noble than the metal present in the metal substrate.

18. An article according to claim 12, wherein, for anodic corrosion protection, the metal-containing particles are more noble than the metal present in the metal substrate.

19. An article according to claim 13, wherein the metal containing substrate has a metallic intermediate layer and on the intermediate layer is deposited the barrier layer.

20. An article according to claim 19, wherein at least one further organic diffusion barrier layer without metal particles is deposited on the barrier layer.

21. An article according to claim 12, wherein the barrier layer comprises finely dispersed metal particles, and the metal of the metal particles comprises a plurality of different metals.

* * * * *